US012695428B2

(12) United States Patent
Maxim et al.

(10) Patent No.: US 12,695,428 B2
(45) Date of Patent: Jul. 28, 2026

(54) POWER PROTECTION LOOP FOR AMPLIFIER CHAIN ELEMENTS

(71) Applicant: Qorvo US, Inc., Greensboro, NC (US)

(72) Inventors: George Maxim, Saratoga, CA (US); Baker Scott, San Jose, CA (US); Stephen James Franck, Felton, CA (US); Hui Liu, San Diego, CA (US); Ziba Nami, Duluth, GA (US)

(73) Assignee: Qorvo US, Inc., Greensboro, NC (US)

( * ) Notice: Subject to any disclaimer, the term of this patent is extended or adjusted under 35 U.S.C. 154(b) by 431 days.

(21) Appl. No.: 18/130,990

(22) Filed: Apr. 5, 2023

(65) Prior Publication Data

US 2023/0387867 A1 Nov. 30, 2023

Related U.S. Application Data

(60) Provisional application No. 63/381,419, filed on Oct. 28, 2022, provisional application No. 63/346,118, filed on May 26, 2022.

(51) Int. Cl.
*H03F 1/52* (2006.01)
*H03F 3/21* (2006.01)
(52) U.S. Cl.
CPC .................. *H03F 1/52* (2013.01); *H03F 3/21* (2013.01); *H03F 2200/171* (2013.01); *H03F 2200/426* (2013.01)
(58) Field of Classification Search
CPC ........ H03F 1/52; H03F 3/21; H03F 2200/171; H03F 2200/426; H03F 2200/258;
(Continued)

(56) References Cited

U.S. PATENT DOCUMENTS 3,641,451 A 2/1972 Hollingsworth et al.
4,122,400 A 10/1978 Medendorp et al.
(Continued)

FOREIGN PATENT DOCUMENTS

CN 112803901 A 5/2021
CN 113746440 A 12/2021
(Continued)

OTHER PUBLICATIONS

Van Bezooijen, A. et al., "Over-Temperature Protection by Adaptive Output Power Control," Proceedings of the 9th European Conference on Wireless Technology, Sep. 2006, Manchester, UK, pp. 350-352.
(Continued)

*Primary Examiner* — Andrea Lindgren Baltzell
*Assistant Examiner* — Khiem D Nguyen
(74) *Attorney, Agent, or Firm* — Withrow & Terranova, P.L.L.C.

(57) ABSTRACT

Power protection loops for amplifier chain elements are disclosed. In one aspect, an amplifier chain may have a power detection circuit detect power within the amplifier chain. When the power exceeds a threshold, a control circuit limits amplification provided by amplifier element(s) within the amplifier chain to throttle or lower power levels within the amplifier chain, thereby protecting elements within the amplifier chain. In this fashion, not only may the amplifier element(s) be protected, but also acoustic filter elements may be protected. The threshold used to throttle or lower the power levels may be based on one or more of: a supply voltage, a sensed temperature, and a mode (e.g., 2G, 3G, 4G, 5G). By protecting these elements, these elements survive power surges instead of failing.

16 Claims, 11 Drawing Sheets

(58) Field of Classification Search
CPC .............. H03F 2200/451; H03F 1/523; H03F 2200/105; H03F 2200/441; H03F 2200/444; H03F 2200/462; H03F 2200/465; H03F 2200/468; H03F 2200/471; H03F 2200/519; H03F 2200/522; H03F 2200/78; H03F 3/213; H03F 3/245; H03F 3/195; H03F 1/30
USPC .................................................. 330/291, 296
See application file for complete search history.

(56) References Cited

U.S. PATENT DOCUMENTS

| | | | |
|---|---|---|---|
| 4,893,158 | A | 1/1990 | Mihara et al. |
| 5,847,610 | A | 12/1998 | Fujita |
| 6,469,919 | B1 | 10/2002 | Bennett |
| 7,193,459 | B1 * | 3/2007 | Epperson ................. H03F 3/24 |
| | | | 330/296 |
| 7,268,990 | B1 | 9/2007 | Loeb et al. |
| 7,852,063 | B2 * | 12/2010 | Kobayashi ............. G01R 21/12 |
| | | | 324/105 |
| 8,344,806 | B1 | 1/2013 | Franck et al. |
| 8,586,256 | B2 | 11/2013 | Yanase et al. |
| 9,960,594 | B1 | 5/2018 | Lin et al. |
| 9,973,204 | B1 | 5/2018 | Venkateswaran et al. |
| 10,027,287 | B1 | 7/2018 | Ichitsubo et al. |
| 10,291,191 | B2 | 5/2019 | Teeter et al. |
| 10,965,225 | B2 | 3/2021 | Hashimoto et al. |
| 11,218,116 | B2 | 1/2022 | Ng et al. |
| 11,728,773 | B2 | 8/2023 | Gebeyehu et al. |
| 11,799,327 | B2 | 10/2023 | Marr, Jr. et al. |
| 2002/0125945 | A1 | 9/2002 | Taylor |
| 2002/0181180 | A1 | 12/2002 | Ivanov et al. |
| 2004/0239428 | A1 | 12/2004 | Apel |
| 2008/0239597 | A1 | 10/2008 | Van Bezooijen et al. |
| 2011/0292554 | A1 | 12/2011 | Yao et al. |
| 2012/0038415 | A1 | 2/2012 | Vanhoucke et al. |
| 2012/0235733 | A1 | 9/2012 | Nakamoto |
| 2015/0015339 | A1 | 1/2015 | Gorbachov et al. |
| 2015/0070092 | A1 | 3/2015 | Ishimoto et al. |
| 2015/0349723 | A1 | 12/2015 | Kwon et al. |
| 2016/0072452 | A1 | 3/2016 | Ripley et al. |
| 2017/0126184 | A1 | 5/2017 | Oh et al. |
| 2019/0036495 | A1 | 1/2019 | Ng et al. |
| 2019/0068137 | A1 | 2/2019 | Wang |
| 2019/0207577 | A1 | 7/2019 | Zhao |
| 2019/0363681 | A1 | 11/2019 | Saegusa |
| 2020/0099457 | A1 | 3/2020 | Lübbers et al. |
| 2020/0335491 | A1 | 10/2020 | Sasaki et al. |
| 2020/0348346 | A1 | 11/2020 | Cho |
| 2021/0211108 | A1 | 7/2021 | Khlat |
| 2021/0226589 | A1 | 7/2021 | Han |
| 2021/0281228 | A1 | 9/2021 | Khlat |
| 2021/0281229 | A1 | 9/2021 | Khlat et al. |
| 2021/0302477 | A1 | 9/2021 | Ehlers |
| 2021/0399691 | A1 | 12/2021 | Saminathan et al. |
| 2022/0200542 | A1 | 6/2022 | Tsutsui et al. |
| 2023/0094883 | A1 | 3/2023 | Scott et al. |
| 2023/0096011 | A1 | 3/2023 | Scott et al. |
| 2023/0253930 | A1 | 8/2023 | Scott et al. |
| 2023/0421194 | A1 | 12/2023 | Voor et al. |

FOREIGN PATENT DOCUMENTS

| | | |
|---|---|---|
| CN | 114070212 A | 2/2022 |
| EP | 3651357 A1 | 5/2020 |
| EP | 3843264 A1 | 6/2021 |
| FR | 3107410 A1 | 8/2021 |
| JP | S64-068005 S | 3/1989 |
| JP | H0479505 A | 3/1992 |
| JP | H09162649 A | 6/1997 |
| JP | 2006501743 A | 1/2006 |
| JP | 2008294977 A | 12/2008 |
| JP | 2011176592 A | 9/2011 |
| JP | 2013102490 A | 5/2013 |
| JP | 2019208092 A | 12/2019 |
| JP | 2020516194 A | 5/2020 |
| JP | 2023529847 A | 7/2023 |
| TW | 201448454 A | 12/2014 |
| TW | 1699963 B | 7/2020 |
| WO | 9419870 A1 | 9/1994 |
| WO | 9531035 A1 | 11/1995 |
| WO | 2008030534 A2 | 3/2008 |
| WO | 2010135711 A1 | 11/2010 |
| WO | 2013099077 A1 | 7/2013 |
| WO | 2023164036 A1 | 8/2023 |

OTHER PUBLICATIONS

International Search Report and Written Opinion for International Patent Application No. PCT/US2022/044114, mailed Jan. 11, 2023, 18 pages.

International Search Report and Written Opinion for International Patent Application No. PCT/US2022/044040, mailed Jan. 17, 2023, 17 pages.

International Search Report and Written Opinion for International Patent Application No. PCT/US2023/013683, mailed Jun. 9, 2023, 16 pages.

Non-Final Office Action for U.S. Appl. No. 17/488,823, mailed Mar. 7, 2024, 9 pages.

Non-Final Office Action for U.S. Appl. No. 17/488,877, mailed Apr. 25, 2024, 21 pages.

Ligtao, J. et al., "Implementation of On-chip OVP, OCP and OTP Circuits for DC-DC Converter Design," 2018 IEEE 10th International Conference on Humanoid, Nanotechnology, Information Technology, Communication and Control, Environment and Management (HNICEM), Nov. 29-Dec. 2, 2018, Baguio City, Philippines, IEEE, 6 pages.

Written Opinion for International Patent Application No. PCT/US2022/044114, mailed Oct. 30, 2023, 21 pages.

International Preliminary Report on Patentability for International Patent Application No. PCT/US2022/044114, mailed Dec. 22, 2023, 19 pages.

Extended European Search Report for European Patent Application No. 23171644.0, mailed Oct. 27, 2023, 14 pages.

Notice of Allowance for U.S. Appl. No. 17/488,823, mailed Aug. 21, 2024, 8 pages.

Notice of Allowance for U.S. Appl. No. 17/488,877, mailed Jul. 26, 2024, 8 pages.

International Search Report and Written Opinion for International Patent Application No. PCT/US2023/025554 mailed Oct. 5, 2023, 15 pages.

Extended European Search Report for European Patent Application No. 23155394.2, mailed Jul. 6, 2023, 12 pages.

* cited by examiner

POWER PROTECTION LOOP FOR AMPLIFIER CHAIN ELEMENTS

PRIORITY APPLICATIONS

The present application claims priority to U.S. Provisional Patent Application Ser. No. 63/381,419 filed on Oct. 28, 2022, and entitled "POWER PROTECTION LOOP FOR AMPLIFIER CHAIN ELEMENTS," the contents of which are incorporated herein by reference in its entirety.

The present application claims priority to U.S. Provisional Patent Application Ser. No. 63/346,118 filed on May 26, 2022, and entitled "ADJUSTABLE POWER-LIMITING LOOP WITH PER-MODE THRESHOLD FOR CONVERGED 2G/3G/4G/5G PAs AND ACOUSTIC FILTER PROTECTION," the contents of which are incorporated herein by reference in its entirety.

BACKGROUND

I. Field of the Disclosure

The technology of the disclosure relates generally to protecting elements in a power amplifier chain from high power conditions that may damage the elements. In particular, the amplifiers and acoustic filters are protected from excessive power conditions.

II. Background

Computing devices abound in modern society, and more particularly, mobile communication devices have become increasingly common. The prevalence of these mobile communication devices is driven in part by the many functions that are now enabled on such devices. Increased processing capabilities in such devices means that mobile communication devices have evolved from pure communication tools into sophisticated mobile entertainment centers, thus enabling enhanced user experiences. With the advent of the myriad functions available to such devices, there has been increased pressure to find ways to improve data transfer between elements. This pressure has generated forward evolution in cellular standards reliant on higher frequencies and increased demand for precise power control at those frequencies. Such demands require power amplifier chains capable of surviving power surges outside the parameters of the cellular standards. Providing such power amplifier chains provides opportunities for innovation.

SUMMARY

Aspects disclosed in the detailed description include power protection loops for amplifier chain elements. In particular, an amplifier chain may have a power detection circuit to detect power within the amplifier chain. When the power exceeds a threshold, a control circuit limits amplification provided by amplifier element(s) within the amplifier chain to throttle or lower power levels within the amplifier chain, thereby protecting elements within the amplifier chain. In this fashion, not only may the amplifier element(s) be protected, but also acoustic filter elements may be protected. The threshold used to throttle or lower the power levels may be based on one or more of: a supply voltage, a sensed temperature, and a mode (e.g., 2G, 3G, 4G, 5G). By protecting these elements, these elements survive power surges instead of failing.

In this regard, in one aspect, an amplifier chain is disclosed. The amplifier chain comprises an amplifier. The amplifier chain also comprises a power detector associated with the amplifier. The amplifier chain also comprises a comparison circuit coupled to the amplifier and configured to compare a signal from the power detector with a threshold value. The amplifier chain also comprises a control circuit coupled to the comparison circuit and configured to modify behavior of the amplifier when the signal from the power detector exceeds the threshold value.

DETAILED DESCRIPTION

Figure 1:
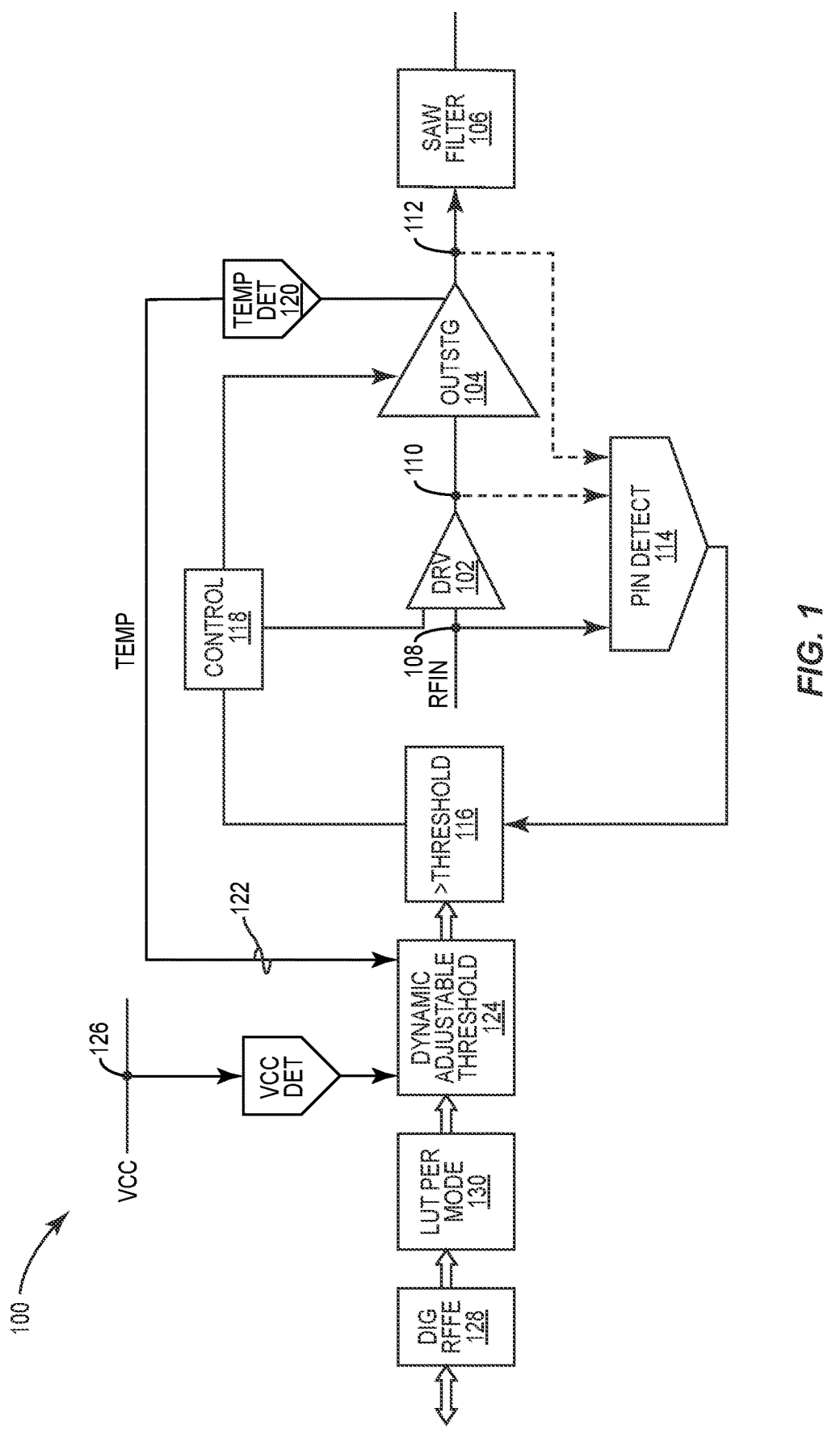
FIG. 1 is a block diagram of an exemplary amplifier chain with a power protection loop operative to protect elements of the amplifier chain from over-power conditions.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that although the terms first, second, etc. may be used herein to describe various elements, these elements should not be limited by these terms. These terms are only used to distinguish one element from another. For example, a first element could be termed a second element, and similarly, a second element could be termed a first element without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element, or intervening elements may also be present. In contrast, when an element is referred to as being "directly on" or extending "directly onto" another element, no intervening elements are present. Likewise, it will be understood that when an element such as a layer, region, or substrate is referred to as being "over" or extending "over" another element, it can be directly over or extend directly over the other element, or intervening elements may also be present. In contrast, when an element is referred to as being "directly over" or extending "directly over" another element, no intervening elements are present. It will also be understood that when an element is referred to as being "connected" or "coupled" to another element, it can be directly connected or coupled to the other element, or intervening elements may be present. In contrast, when an element is referred to as being "directly connected" or "directly coupled" to another element, no intervening elements are present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning consistent with their meaning in the context of this specification and the relevant art and will not be interpreted in an idealized or overly formal sense unless expressly so defined herein.

Aspects disclosed in the detailed description include power protection loops for amplifier chain elements. In particular, an amplifier chain may have a power detection circuit to detect power within the amplifier chain. When the power exceeds a threshold, a control circuit limits amplification provided by amplifier element(s) within the amplifier chain to throttle or lower power levels within the amplifier chain, thereby protecting elements within the amplifier chain. In this fashion, not only may the amplifier element(s) be protected, but also acoustic filter elements may be protected. The threshold used to throttle or lower the power levels may be based on one or more of: a supply voltage, a sensed temperature, and a mode (e.g., 2G, 3G, 4G, 5G). By protecting these elements, these elements survive power surges instead of failing.

Before addressing exemplary aspects of the present disclosure, an overview of existing protection schemes is provided. More specifically, most amplifier chains are used in transceivers as part of a wireless transmission scheme according to a cellular standard or mode, such as second-generation (2G), third-generation (3G), fourth-generation (4G), fifth-generation (5G), some permutation of those, or, in the future, some new cellular standard. These amplifier chains include elements like the amplifiers and acoustic filters, which are sensitive to power levels. That is, if these elements are exposed to over-power conditions, the elements may fail, resulting in a failure of the amplifier chain, the transceiver, and, for most purposes, the failure of the mobile computing device that includes the transceiver. One way such elements are protected is through a voltage clamp formed from a stack of one or more diodes. These clamps are relatively inflexible (particularly when switching between modes) and offer voltage caps at fixed values, which may not coincide with desired values. While the owner of this disclosure has proposed a variety of over-power protection loops, such loops may protect amplifiers while leaving acoustic filters still vulnerable to damage. While many amplifier chains can protect the amplifier chain during normal operation, some designers are proposing new stress tests which put additional performance burdens on the amplifier chains. Meeting these new stress tests and the use cases which inspire such stress tests has challenged existing clamp and over-power protection loop solutions.

Exemplary aspects of the present disclosure contemplate improving existing amplifier chain protection solutions by adding another over-power loop that detects power levels within the amplifier chain. This detected power level might be compared to a threshold. The threshold is set based on a supply voltage, a temperature in the die containing the amplifier chain, and a mode indication. When the threshold is exceeded (indicating a power condition high enough to potentially damage an element of the amplifier chain), a control circuit adjusts operation of amplifiers within the amplifier chain to reduce power levels to sustainable levels.

In this regard, FIG. 1 is a block diagram of an amplifier chain 100 with vulnerable elements, including a driver amplifier 102, an output amplifier 104, and a filter 106. It should be appreciated that the amplifiers 102 and 104 may be formed from multiple transistors. The filter 106 may be an acoustic filter and, more particularly, may be a surface acoustic wave (SAW) filter, a bulk acoustic wave (BAW) filter, a high-frequency SAW (HFSAW), or the like. Likewise, there may be additional amplifier stages (not shown), such as a pre-driver stage, an intermediate stage, or the like. Further, while generally shown as single-ended elements, it should be appreciated that the elements may be differential, quadrature, Doherty amplifiers, or the like without departing from the present disclosure.

The amplifier chain 100 may detect power levels (directly or indirectly, as explained in greater detail below) at a detection node such as an input node 108 before the driver amplifier 102, at an intermediate node 110 between the driver amplifier 102 and the output amplifier 104, or at an output node 112 after the output amplifier 104. If other amplifier stages are present, additional detection nodes may be possible. A detection circuit 114 is coupled to the detection node and indicates a power level to a comparison circuit 116, which compares the power level (or a proxy for the power level) to a threshold value and provides an indication of whether the threshold value is exceeded to a control circuit 118. The control circuit 118 adjusts operation of the amplifiers 102 or 104 (or other amplifiers if present in the amplifier chain 100) to reduce power levels and protect the vulnerable elements.

Additionally, a temperature sensor 120 may provide a temperature detect signal 122 to a threshold setting control circuit 124. While having the temperature sensor 120 in or in close proximity to the filter 106 may be preferable, such placement may be difficult to design. Accordingly, the temperature sensor 120 may be in or proximate to the circuitry (e.g., transistors) that forms the output amplifier 104.

The threshold setting control circuit 124 may further receive information about a supply voltage (Vcc 126) being used. Still, further, an indication of mode (e.g., 2G/3G/4G/ 5G) being used may be provided from a digital radio frequency front end (RFFE) element 128 (or something like a baseband processor). The mode being used may be cross-referenced in a look-up table (LUT) 130 or other memory element to provide adjustments to the threshold setting control circuit 124. Note that the LUT 130 may be integrated into the threshold setting control circuit 124. Based on the values received, the threshold setting control circuit 124 may set a dynamic adjustable threshold value for use by the comparison circuit 116. The threshold value may change if the mode, temperature, or supply voltage changes.

Figure 2:
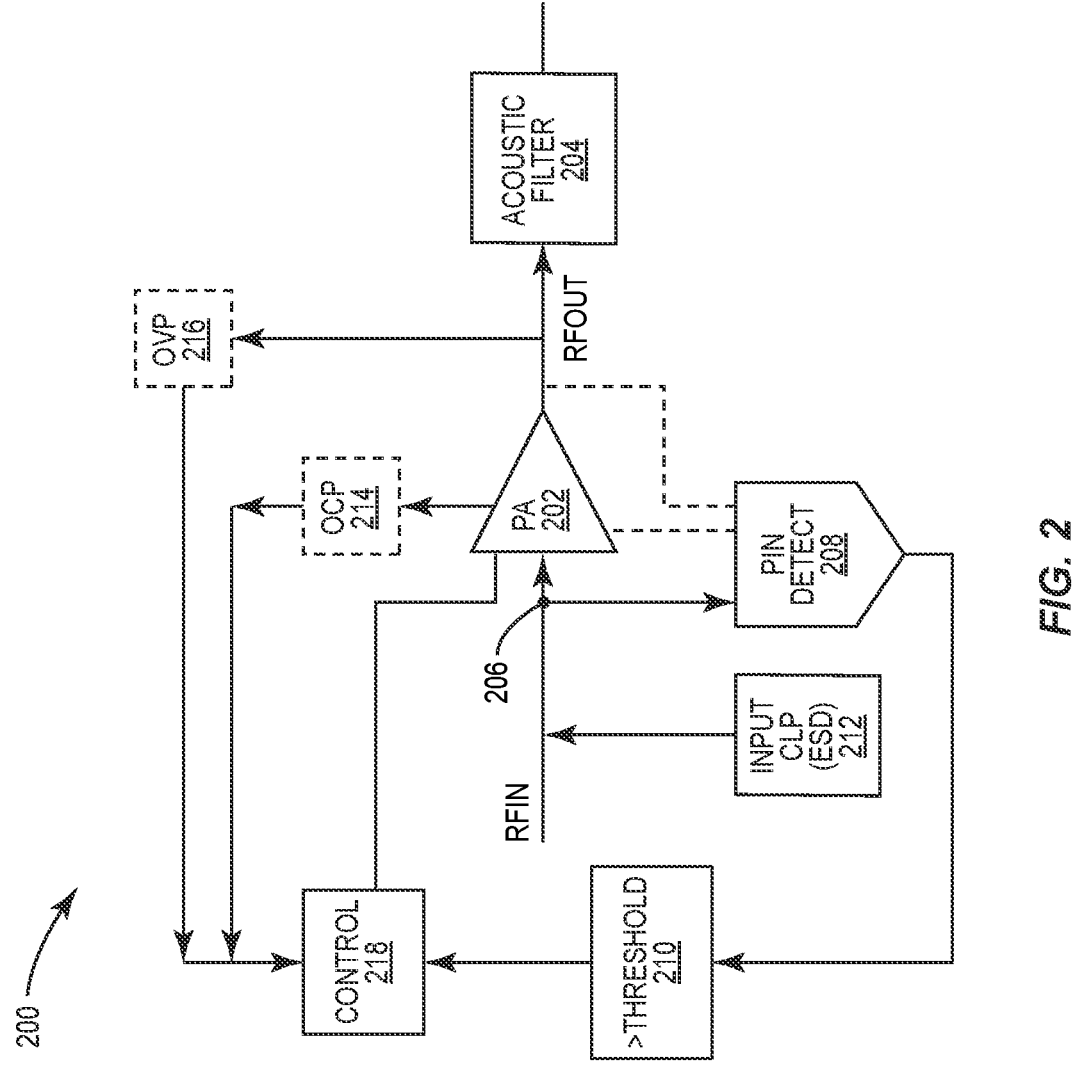
FIG. 2 is a block diagram of an exemplary amplifier chain with a power protection loop like FIG. 1, but with additional voltage clamps, over-voltage protection (OVP), and over-current protection (OCP) loops to protect elements of the amplifier chain from over-power conditions.

Note that the use of the protection loop of the present disclosure does not preclude the use of other protection options. FIG. 2 shows how an aspect of the present disclosure may be used with other protection options. Specifically, an amplifier chain 200 may include amplifier elements 202 and an acoustic filter 204. The power protection loop of the present disclosure in this aspect detects power at an input node 206 with a power detector 208 for use by a comparison circuit 210. In addition, the power level at the input node 206 may be clamped by an input clamp 212. The input clamp 212 may seem redundant, but since the input clamp 212 is faster acting than the power protection loop, the input clamp 212 may be set at a higher threshold value and accordingly be little used while remaining present to protect against fast transients. Note that other clamps may be present (not shown), such as an interstage clamp or an output clamp. Additionally, an over-current protection (OCP) loop 214 and/or an over-voltage protection (OVP) loop 216 may be present and provide signals to a control circuit 218.

The control circuit 118 of FIG. 1 or 218 of FIG. 2 may be implemented in a variety of ways. In a first exemplary aspect, the control circuit may be a regulator. In a second exemplary aspect, the control circuit may be a bias circuit (as better illustrated in FIG. 4). In still a further exemplary aspect, the control circuit may be a regulator for one stage and a bias circuit for another stage (as better illustrated in FIG. 3).

Figure 3:
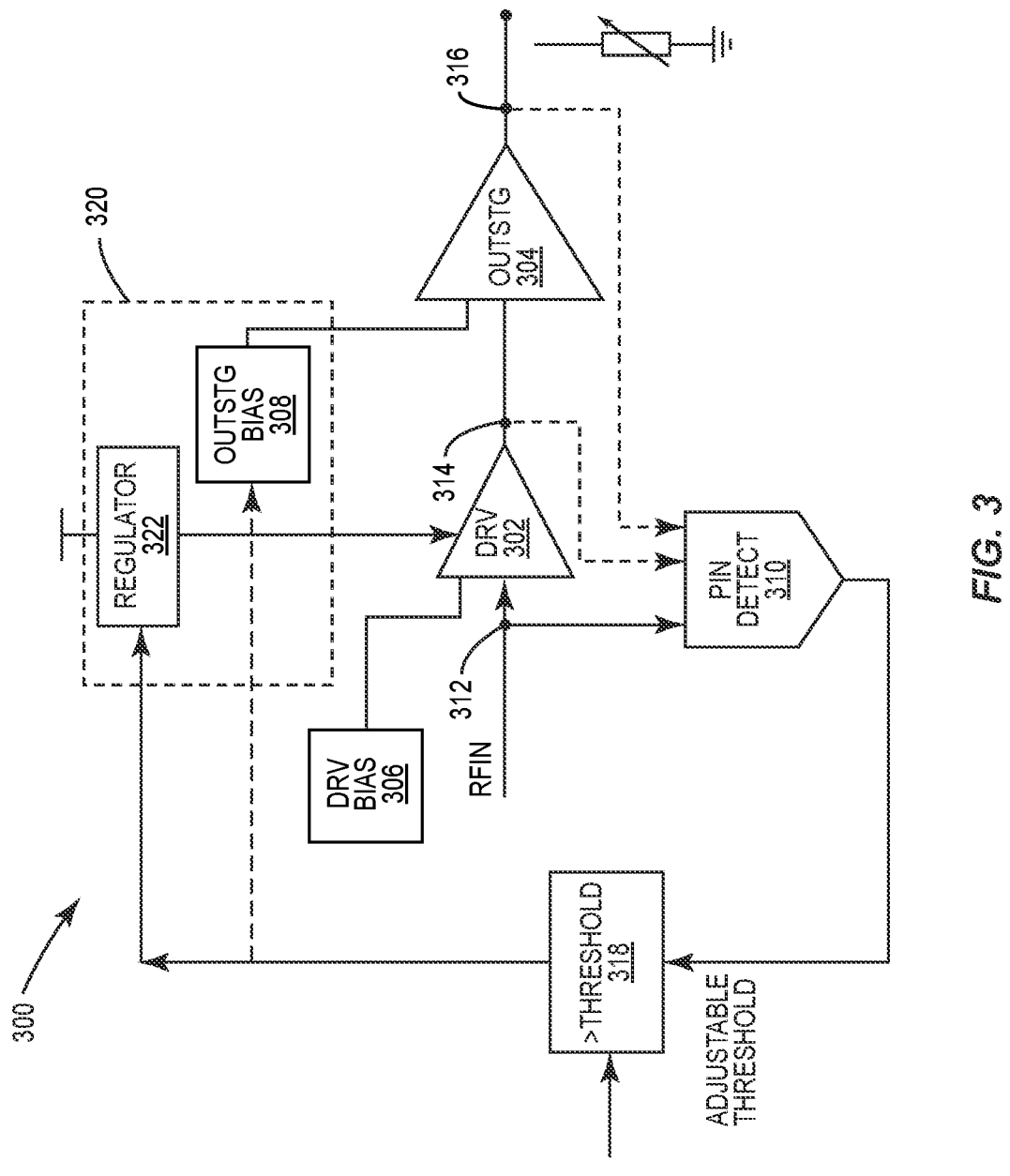
FIG. 3 is a block diagram of an exemplary amplifier chain where a control circuit to adjust power levels responsive to the power protection loop is a regulator.

In this regard, FIG. 3 shows an amplifier chain 300 with a driver amplifier 302 and an output amplifier 304. The driver amplifier 302 has an associated driver bias circuit 306, while the output amplifier 304 has an associated output bias circuit 308. The power protection loop of the present disclosure may detect power with a power detector 310 at nodes 312, 314, or 316. A comparison circuit 318 compares the indication of power to a threshold value and provides a signal to a control circuit 320. The control circuit 320 includes a regulator 322, limiting power and voltage for the driver amplifier 302. As such, the regulator 322 provides fine control and relatively fast control of the driver amplifier 302. Additionally, the control circuit 320 may include the output bias circuit 308. Output amplifiers rarely have regulators, so control through the output bias circuit 308 may be the best that can be done to provide additional power protection. Note that including the output bias circuit 308 in the control circuit 320 is optional.

Figure 4:
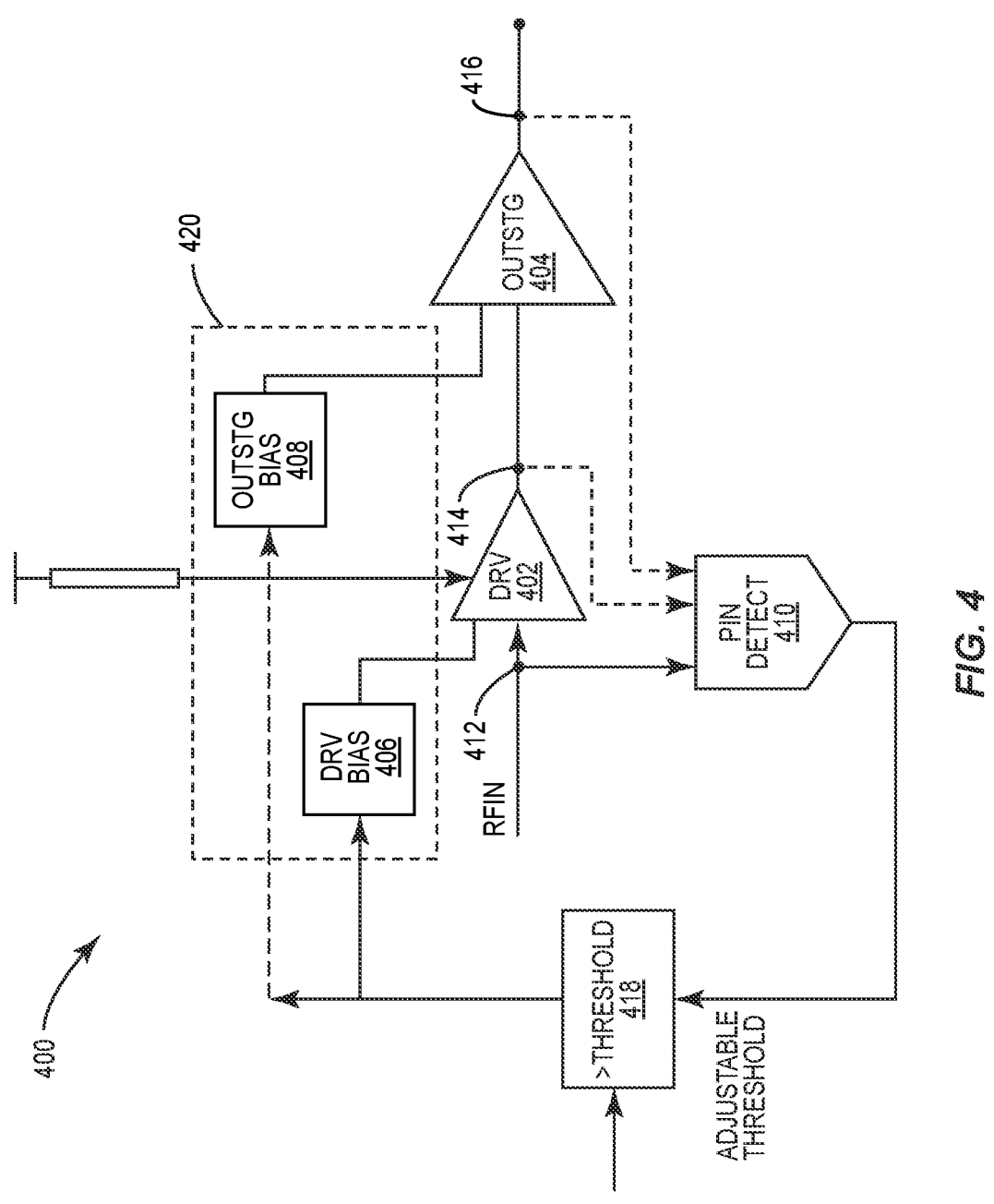
FIG. 4 is a block diagram of an exemplary amplifier chain where a control circuit to adjust power levels responsive to the power protection loop is a bias circuit.

In contrast, FIG. 4 shows an amplifier chain 400 with a driver amplifier 402 and an output amplifier 404. The driver amplifier 402 has an associated driver bias circuit 406, while the output amplifier 404 has an associated output bias circuit 408. The power protection loop of the present disclosure may detect power with a power detector 410 at nodes 412, 414, or 416. A comparison circuit 418 compares the indication of power to a threshold value and provides a signal to a control circuit 420. The control circuit 420 includes the driver bias circuit 406. Additionally, the control circuit 420 may include the output bias circuit 408. If there are other amplifier stages (not shown) with associated bias circuits (also not shown), such additional associated bias circuits may optionally be included in the control circuit 420.

Figures 5A, 5B:
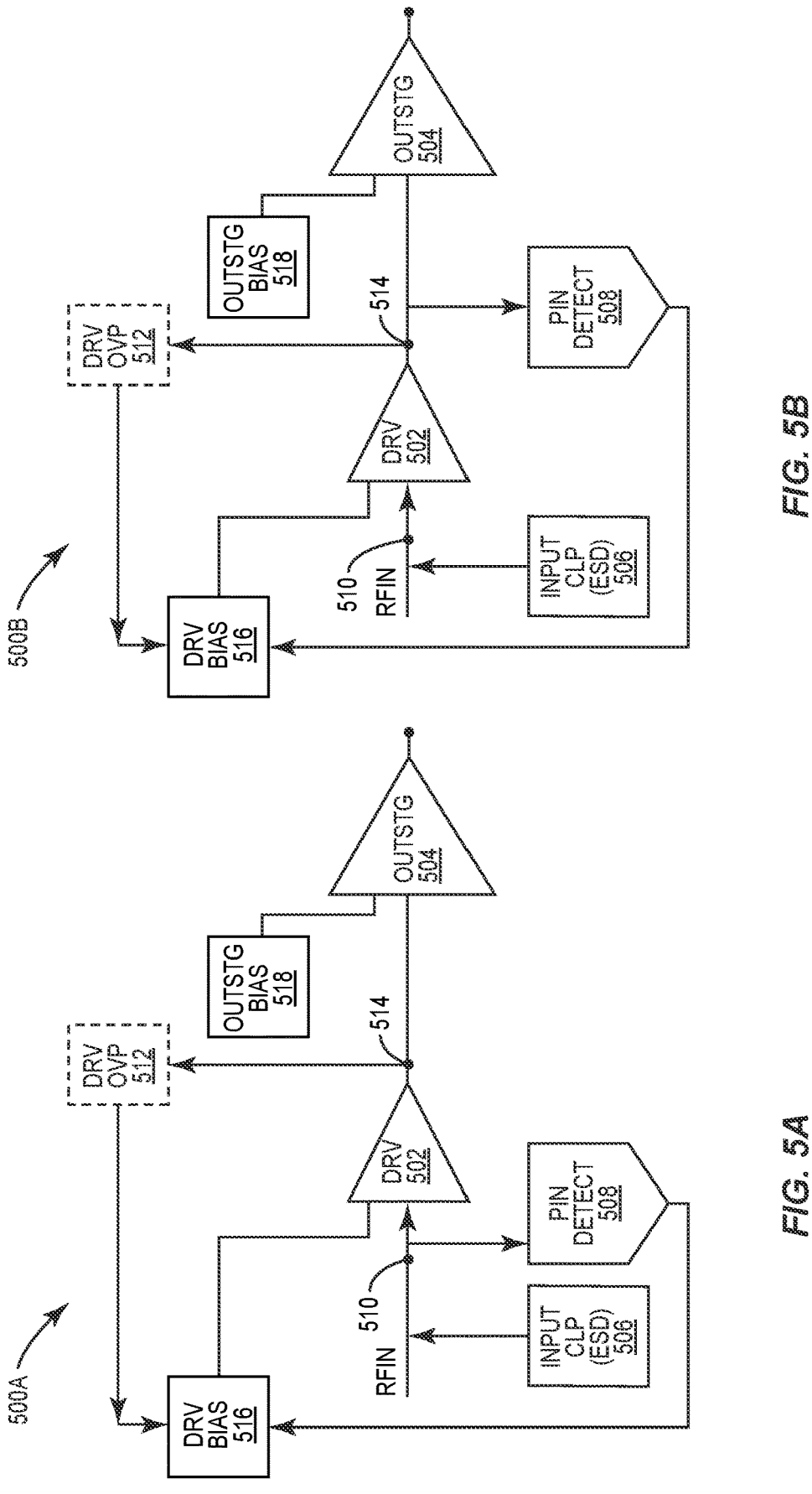
FIGS. 5A-5D are block diagrams of amplifier chains illustrating possible power detection points as well as possible concurrent OVP loop options.

As noted above, the power detection circuit may be coupled to a variety of nodes in the amplifier chain. Likewise, OVP loops may be varied. FIGS. 5A-5D show a variety of configurations with the understanding that further variations are still within the scope of the present disclosure. For example, FIG. 5A illustrates an amplifier chain 500A with a driver amplifier 502 and an output amplifier 504. An input clamp 506 and a power detector 508 are provided at an input node 510. A driver OVP loop 512 taps in at an interstage node 514 at an output of the driver amplifier 502. A control circuit (not shown explicitly) may control bias circuits 516, 518, or a regulator (not shown) as previously described.

FIG. 5B is similar, but in the amplifier chain 500B, the power detector 508 is moved to the interstage node 514.

Figures 5C, 5D:
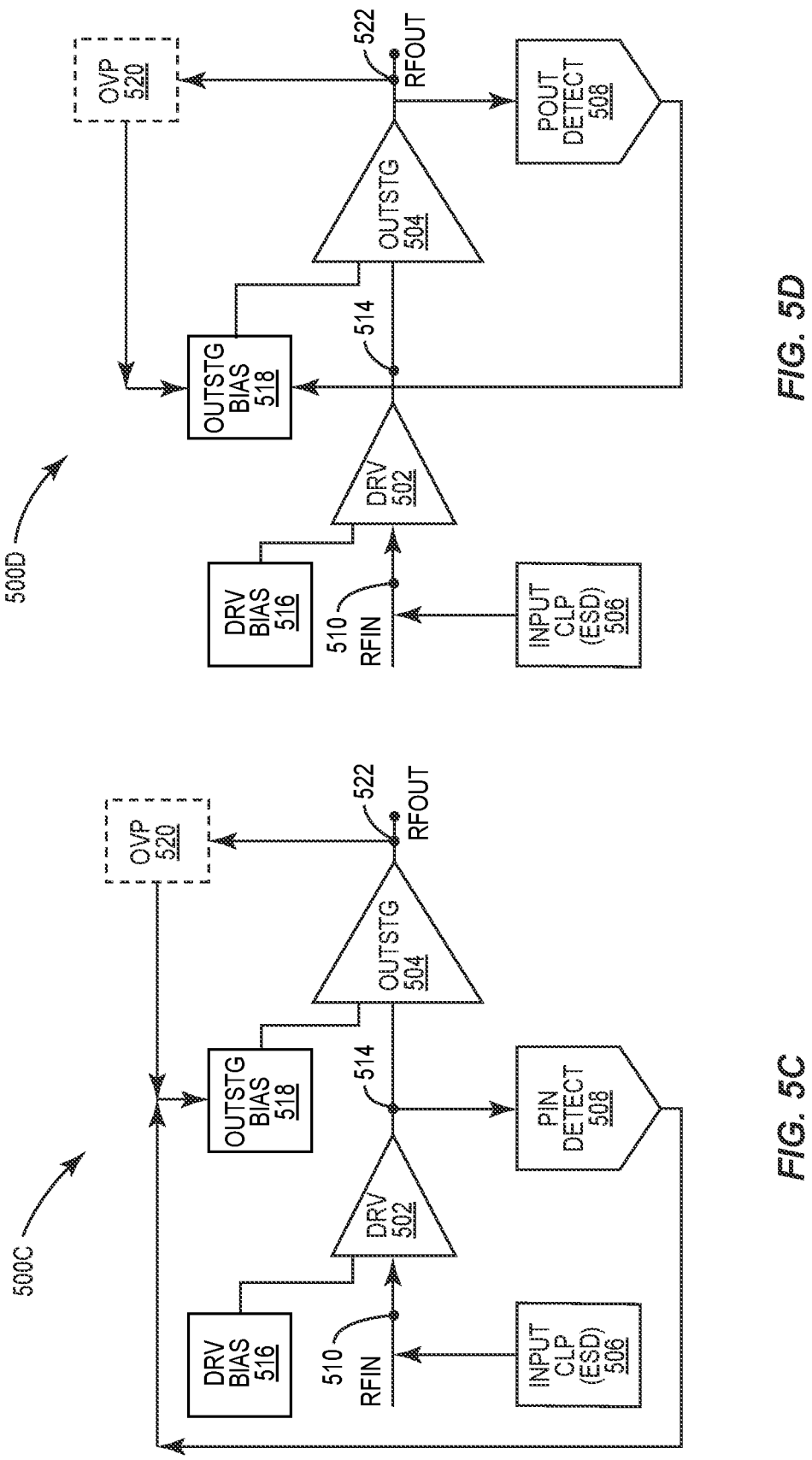

FIG. 5C is similar, but the amplifier chain 500C adds an OVP loop 520 coupled to an output node 522 in place of the driver OVP loop 512. Both the power protection loop of the present disclosure and the OVP loop 520 control the bias circuit 518.

FIG. 5D is similar, but the amplifier chain 500D moves the power detector 508 to the output node 522 as well, and both the power protection loop of the present disclosure and the OVP loop 520 control the bias circuit 518.

Figure 6:
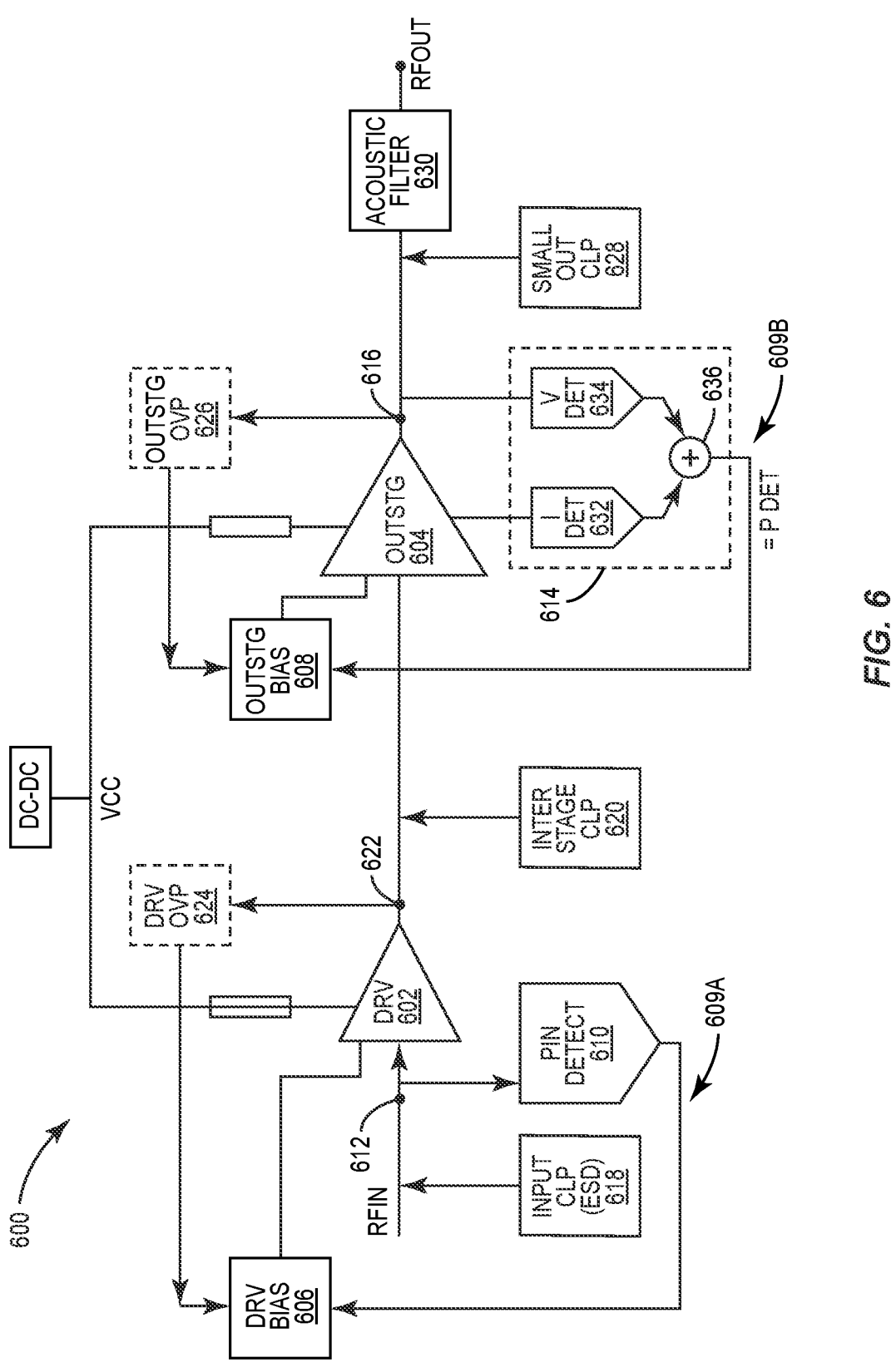
FIG. 6 is a block diagram of an amplifier chain with an exemplary power detection circuit at an output stage output.

An even more complex amplifier chain having two power protection loops is illustrated in FIG. 6, which shows an amplifier chain 600 with a driver amplifier 602 and an output amplifier 604. The driver amplifier 602 has an associated driver bias circuit 606, while the output amplifier 604 has an associated output bias circuit 608. The power protection loop of the present disclosure may include two subloops 609A, 609B, and may detect power with a power detector 610 at input node 612 and a power detector 614 at output node 616. An input clamp 618 is also present at the input node 612. An interstage clamp 620 is present at an interstage node 622. A driver OVP loop 624 is also coupled to the interstage node 622. The driver bias circuit 606 is controlled by the driver OVP loop 624 and the power protection subloop 609A. An output OVP loop 626 is also coupled to the output node 616. The output bias circuit 608 is controlled by the output OVP loop 626 and the power protection subloop 609B. An output clamp 628 may also be present at the output node 616. Collectively, the clamps 618, 620, and 628, along with OVP loops 624, 626, and the overpower loop (including subloops 609A, 609B) help protect the amplifiers 602, 604, and the filter 630 from damage.

At nodes 612 and 622, the impedance is relatively well controlled (e.g., fifty ohms (50Ω)). As such, current is readily derived with a voltage measurement, and power is readily ascertained from the voltage measurement coupled with the known resistance ($P=V^2/R$). Thus, the power detector 610 may be a simple voltage detector. In contrast, at the output node 616, the impedance may fluctuate substantially as a function of the relatively volatile voltage standing wave ratio (VSWR) from the antenna (not shown) and the filter 630. Thus, simply measuring voltage at the output node 616 may not give a reliable power measurement since R may not be known reliably. The power detector 614 may include a current detector 632 and a voltage detector 634. Multiplication may be difficult to implement in a die structured to provide amplifiers, but for the present disclosure, the summation of current and voltage may be a reasonable proxy for detected power, and a summation circuit 636 may sum the values from the detectors 632, 634 to control the output bias circuit 608.

Figure 7:
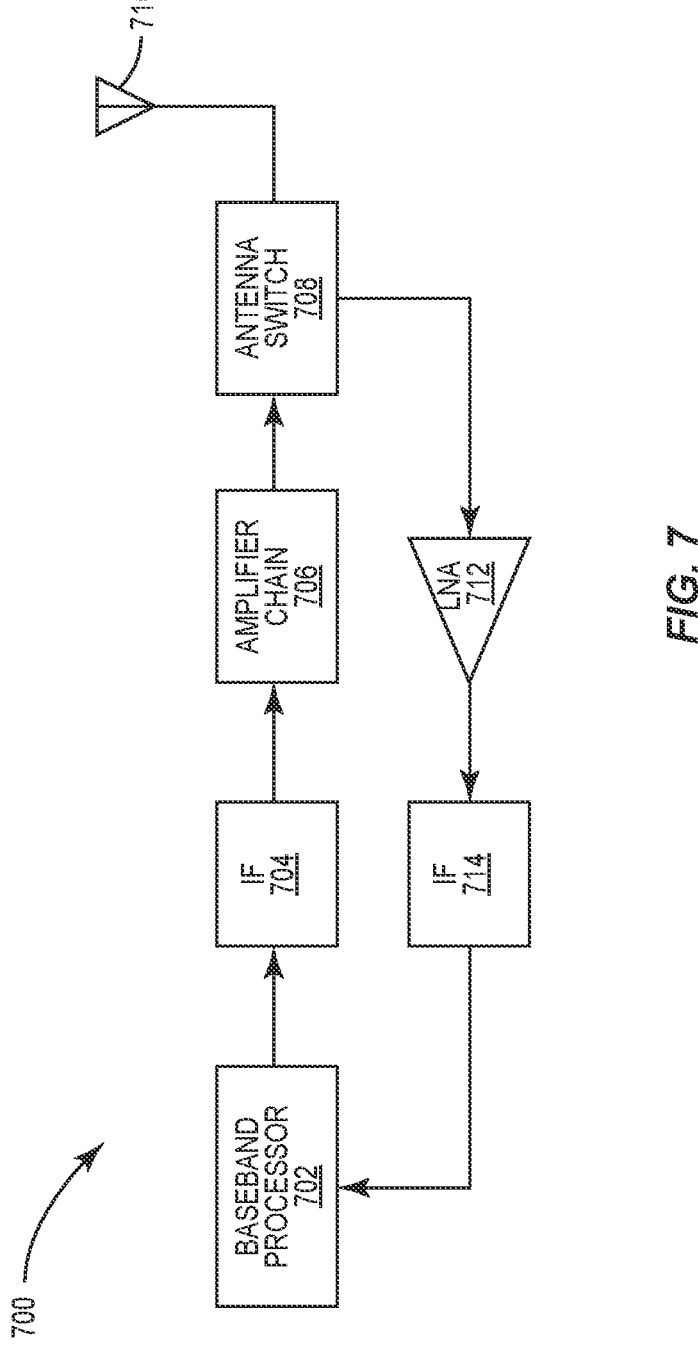
FIG. 7 is a block diagram of a transceiver with an amplifier chain according to the present disclosure contained therein.

To assist in understanding context for the present disclosure, a block diagram of a transceiver 700 is provided in FIG. 7. The transceiver 700 includes a baseband processor (BBP) 702, which provides a signal to be transmitted to an intermediate frequency circuit 704, which may upconvert the signal to an intermediate frequency and/or a radio frequency for transmission. The BBP 702 may also provide a mode indication to the control circuit (not shown) for consideration by the LUT or the like. According to the present disclosure, the IF circuit 704 is coupled to an amplifier chain 706. The amplifier chain 706 is coupled to a switch 708. The switch 708 is coupled to an antenna 710 and a receive path. Signals may pass from the amplifier chain 706 to the antenna 710 through the switch 708. Likewise, signals received at the antenna 710 may pass through the switch 708 to a low noise amplifier (LNA) 712 and then be downconverted by another IF circuit 714 before being handled by the BBP 702. Other transceiver structures may also benefit from the teachings of the present disclosure.

Figures 8A, 8B, 8C, 8D:
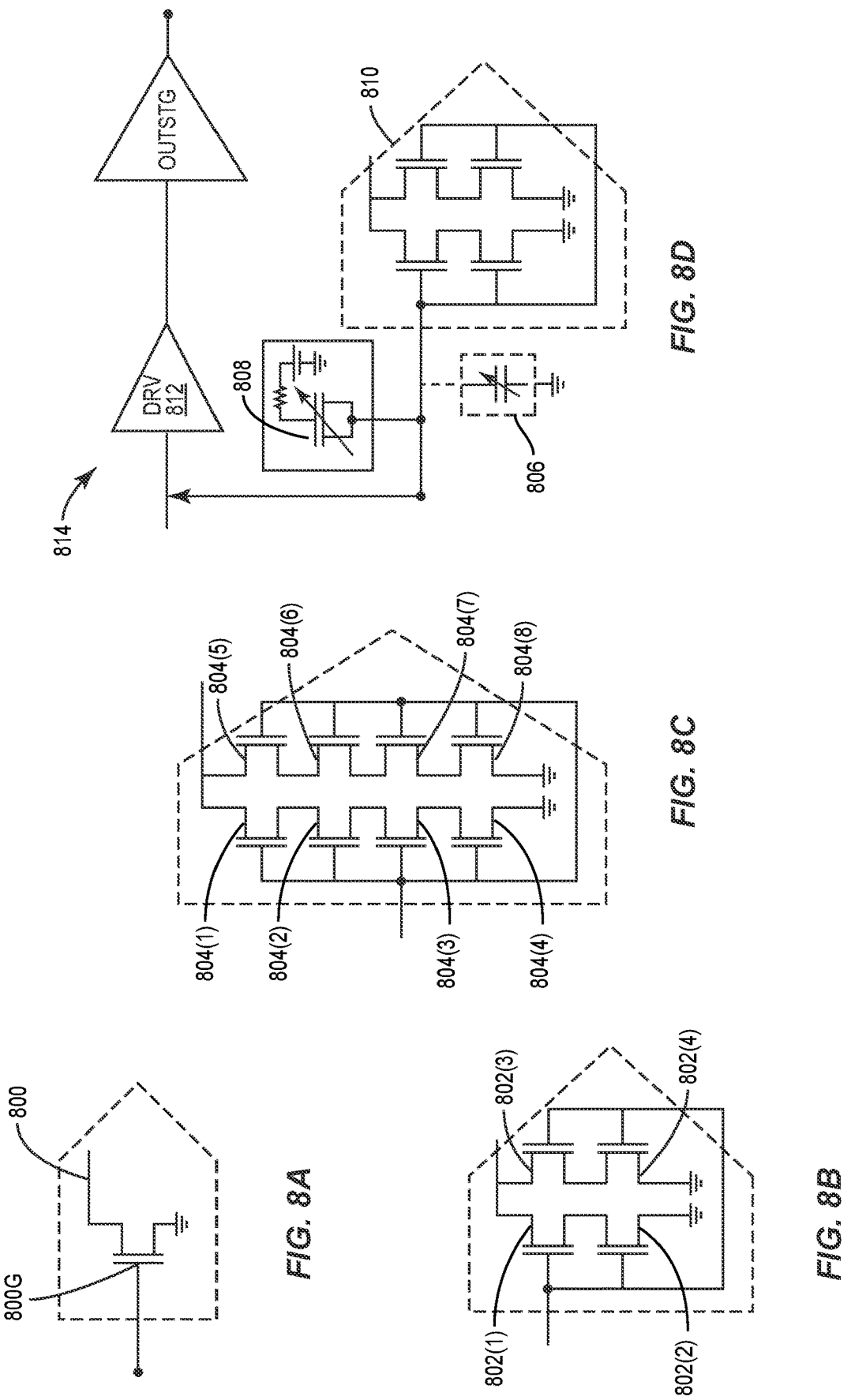
FIGS. 8A-8C are circuit diagrams of possible detector circuits that may be used as power detectors for the present disclosure.
FIG. 8D shows the detector circuit of FIG. 8B with an amplifier chain.

FIGS. 8A-8C show different types of voltage detectors that may be used in the power detectors of the present disclosure. In particular, FIG. 8A shows a single field effect transistor (FET) 800 that turns on when a voltage at a gate 800G exceeds the threshold value of the FET 800. This relatively small input detection may result in large threshold variability and is not a perfect solution. FIG. 8B illustrates a set of stacked and parallel FETs 802(1)-802(4), with less threshold variability and a higher threshold to turn on. FIG. 8C illustrates a large set of stacked and parallel FETs 804(1)-804(8), which has low threshold variability but begins to take up more space and may consume power beyond design preferences. Accordingly, the structure of FIG. 8B may be an optimal compromise for some designers.

When coupled to a node for voltage detection, the detectors of FIGS. 8A-8C may have a non-linear capacitance modeled by variable capacitance 806 in FIG. 8D, which may negatively affect operation. Accordingly, a varactor 808 may be coupled to a detector 810 to provide an approximate inverse of the variable capacitance 806 to lead to a constant overall input impedance for an amplifier 812 of amplifier chain 814.

Figure 9:
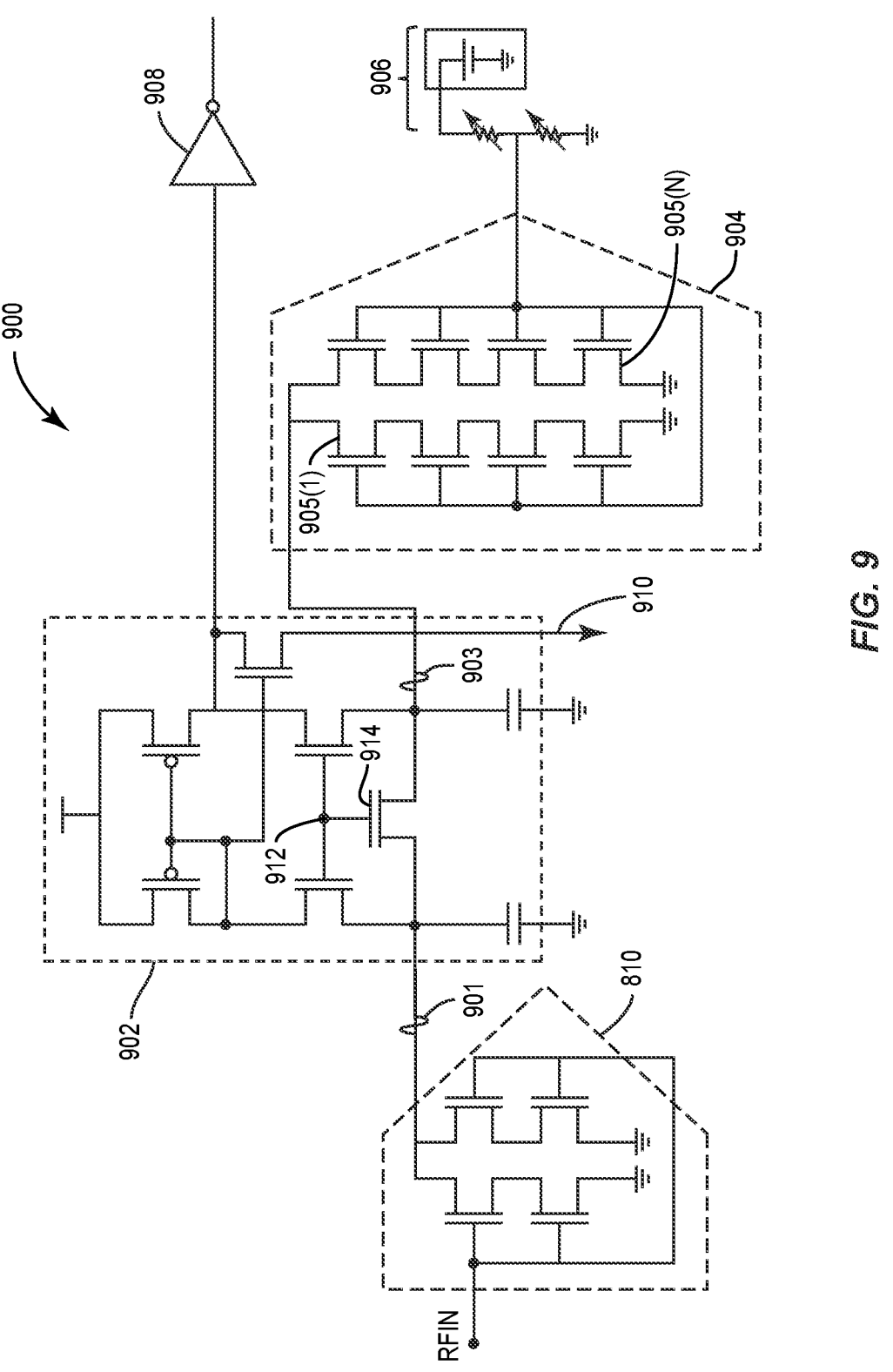
FIG. 9 is a circuit diagram of a detector circuit, a comparison circuit, and a reference circuit that may be used to instantiate aspects of the present disclosure.

While the comparison circuit used to compare the signal from the power detector discussed above may be a comparator, it is more likely a subtraction comparison circuit, as illustrated by power protection loop 900 of FIG. 9. The detector 810 may provide a signal 901 to a comparison circuit 902 proportional to a voltage of an RFin signal. The comparison circuit 902 also receives a threshold signal 903 from a reference circuit 904. The value of the threshold signal 903 is set by the number of FETs 905(1)-905(N) in the reference circuit 904 as modified by a variable resistor network 906. A calibrated bandgap voltage is applied to the variable resistor network 906, which turns on and off a desired number of FETs 905 within the reference circuit 904. The temperature, supply voltage, and mode signals set the values of the variable resistor network 906. The signal 903 is subtracted from the signal 901 by the comparison circuit 902 and output signals 908 and 910 are generated when the signal 901 exceeds the signal 903 (i.e., signal 901 minus signal 903 >0). The signal 908 may generate an alarm and/or be used to activate the control circuit. Likewise, the signal 910 may be used to debias an amplifier using a respective bias circuit (not shown in FIG. 9).

A node 912 within the comparison circuit 902 is illustrated as a floating node but is actually held at a known voltage. A FET 914 holds a bias on the reference circuit 902, so it may act relatively fast when the signal 901 arrives. Otherwise, the signal 901 may have to "turn on" various FETs within the comparison circuit 902, slowing responsiveness. Other comparison circuits could also be used.

It should also be noted that the materials used in the amplifier chain may assist in design. For example, an amplifier chain may be a hybrid structure with a driver stage formed in a complementary metal oxide semiconductor (CMOS) structure and the output stage formed in a bipolar structure (e.g., gallium arsenide (GaAs)). The CMOS structures allow for some digital control through the use of digital-to-analog converters (DACs) and the like. The present disclosure is not limited to such hybrid structures.

The amplifier chains with power protection according to aspects disclosed herein may be provided in or integrated into any processor-based device. Examples, without limitation, include a set-top box, an entertainment unit, a navigation device, a communications device, a fixed location data unit, a mobile location data unit, a global positioning system (GPS) device, a mobile phone, a cellular phone, a smartphone, a session initiation protocol (SIP) phone, a tablet, a phablet, a server, a computer, a portable computer, a mobile computing device, a wearable computing device (e.g., a smartwatch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 10:
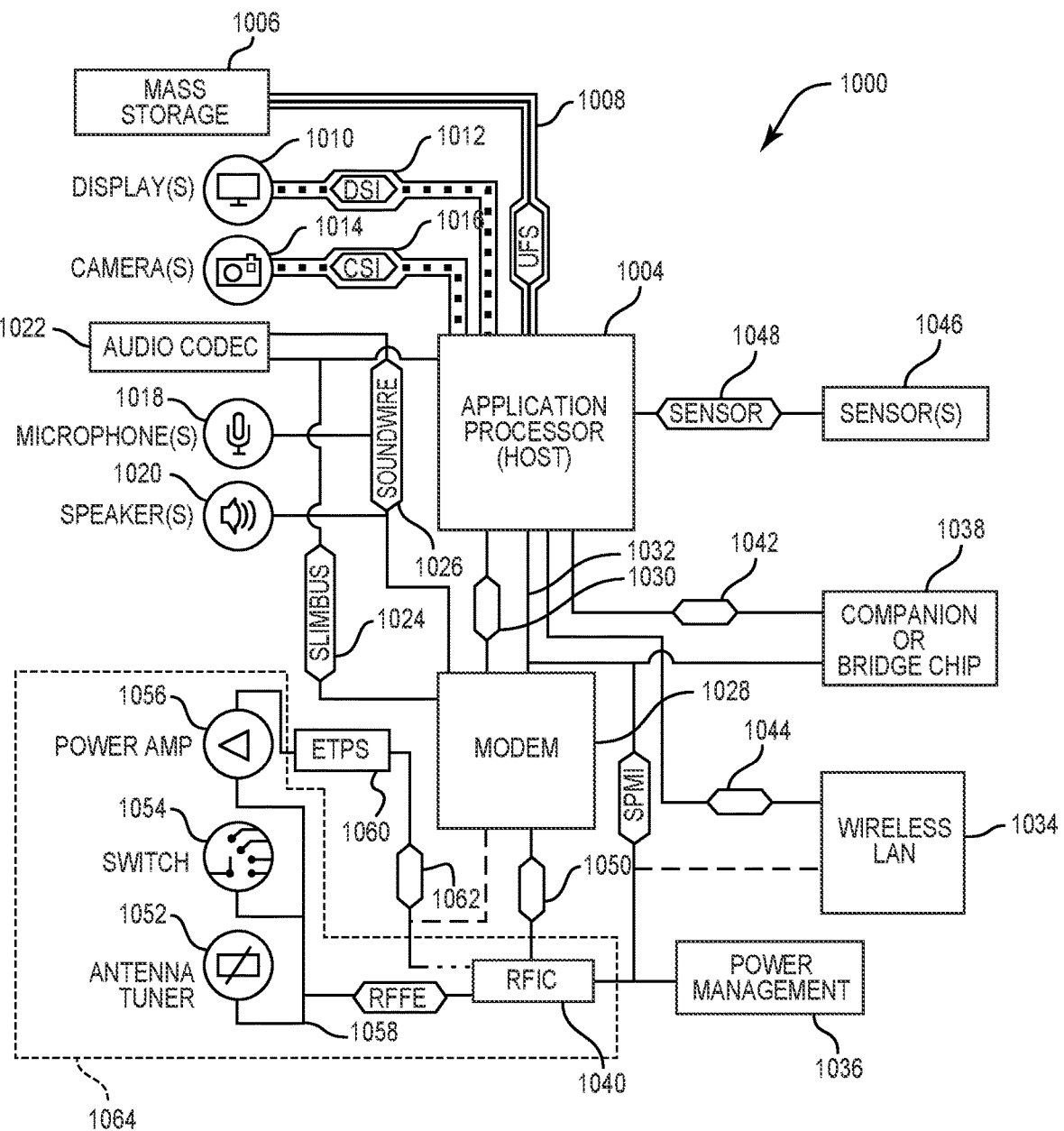
FIG. 10 is a block diagram of a mobile terminal, which may include the transceiver of FIG. 7 and the associated amplifier chain according to the present disclosure.

In this regard, FIG. 10 is a system-level block diagram of an exemplary mobile terminal 1000, such as a smartphone, mobile computing device tablet, or the like. The mobile terminal 1000 includes an application processor 1004 (sometimes referred to as a host) that communicates with a mass storage element 1006 through a universal flash storage (UFS) bus 1008. The application processor 1004 may further be connected to a display 1010 through a display serial interface (DSI) bus 1012 and a camera 1014 through a camera serial interface (CSI) bus 1016. Various audio elements such as a microphone 1018, a speaker 1020, and an audio codec 1022 may be coupled to the application processor 1004 through a serial low-power interchip multimedia bus (SLIMbus) 1024. Additionally, the audio elements may communicate with each other through a SOUNDWIRE bus 1026. A modem 1028 may also be coupled to the SLIMbus 1024 and/or the SOUNDWIRE bus 1026. The modem 1028 may further be connected to the application processor 1004 through a peripheral component interconnect (PCI) or PCI express (PCIe) bus 1030 and/or a system power management interface (SPMI) bus 1032.

With continued reference to FIG. 10, the SPMI bus 1032 may also be coupled to a local area network (LAN or WLAN) IC (LAN IC or WLAN IC) 1034, a power management integrated circuit (PMIC) 1036, a companion IC (sometimes referred to as a bridge chip) 1038, and a radio frequency IC (RFIC) 1040. It should be appreciated that separate PCI buses 1042 and 1044 may also couple the application processor 1004 to the companion IC 1038 and the WLAN IC 1034. The application processor 1004 may further be connected to sensors 1046 through a sensor bus 1048. The modem 1028 and the RFIC 1040 may communicate using a bus 1050.

With continued reference to FIG. 10, the RFIC 1040 may couple to one or more RFFE elements, such as an antenna tuner 1052, a switch 1054, and a power amplifier 1056 through a radio frequency front end (RFFE) bus 1058. Additionally, the RFIC 1040 may couple to an envelope tracking power supply (ETPS) 1060 through a bus 1062, and the ETPS 1060 may communicate with the power amplifier 1056. The power amplifier 1056 may include the amplifier chain with power protection loops of the present disclosure. Collectively, the RFFE, elements, including the RFIC 1040, may be considered an RFFE system 1064. It should be appreciated that the RFFE bus 1058 may be formed from a clock line and a data line (not illustrated).

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications, as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

What is claimed is:

1. An amplifier chain comprising:
an amplifier;
a power detector associated with the amplifier;
a comparison circuit coupled to the amplifier and configured to compare a signal from the power detector with a threshold value; and
a control circuit coupled to the comparison circuit and configured to modify behavior of the amplifier when the signal from the power detector exceeds the threshold value based on a supply voltage, a mode indication, or a temperature.

2. The amplifier chain of claim 1, wherein the amplifier comprises a driver amplifier.

3. The amplifier chain of claim 2, wherein the control circuit comprises a regulator.

4. The amplifier chain of claim 1, wherein the control circuit comprises a bias circuit.

5. The amplifier chain of claim 2, wherein the amplifier further comprises an output amplifier serially coupled to the driver amplifier.

6. The amplifier chain of claim 5, wherein the power detector is coupled to an output node at an output of the output amplifier.

7. The amplifier chain of claim 5, wherein the power detector is coupled to an interstage node between the driver amplifier and the output amplifier.

8. The amplifier chain of claim 2, wherein the power detector is coupled to an input node of the driver amplifier.

9. The amplifier chain of claim 1, wherein the power detector comprises a voltage detector.

10. The amplifier chain of claim 1, wherein the power detector comprises a voltage detector and a current detector.

11. The amplifier chain of claim 1, further comprising a temperature sensor.

12. The amplifier chain of claim 1, further comprising a clamp associated with the amplifier and configured to clamp a voltage for the amplifier at a second threshold value higher than the threshold value.

13. The amplifier chain of claim 1, further comprising an over-voltage protection (OVP) loop associated with the amplifier.

14. The amplifier chain of claim 1, further comprising a filter coupled to the amplifier.

15. The amplifier chain of claim 14, wherein the threshold value is set below a voltage that damages the filter.

16. The amplifier chain of claim 14, wherein the filter comprises an acoustic filter.

* * * * *